US008720331B2

(12) United States Patent
Abe et al.

(10) Patent No.: US 8,720,331 B2
(45) Date of Patent: May 13, 2014

(54) SCREEN PRINTING APPARATUS AND METHOD FOR PRINTING OF CIRCUIT BOARD INCLUDING A MASK HAVING TWO DIFFERENT PATTERNS FOR PRINTING DIFFERENT PARTS OF THE CIRCUIT BOARD IN SEPARATE PRINTING STEPS

(75) Inventors: Seiko Abe, Osaka (JP); Tetsuya Tanaka, Yamanashi (JP)

(73) Assignee: Panasonic Corporation, Osaka (JP)

( * ) Notice: Subject to any disclaimer, the term of this patent is extended or adjusted under 35 U.S.C. 154(b) by 321 days.

(21) Appl. No.: 13/255,367

(22) PCT Filed: Feb. 22, 2010

(86) PCT No.: PCT/JP2010/001161
§ 371 (c)(1),
(2), (4) Date: Sep. 8, 2011

(87) PCT Pub. No.: WO2010/106741
PCT Pub. Date: Sep. 23, 2010

(65) Prior Publication Data
US 2011/0315028 A1 Dec. 29, 2011

(30) Foreign Application Priority Data
Mar. 16, 2009 (JP) ................................. 2009-062317

(51) Int. Cl.
*B41F 15/08* (2006.01)
*B41F 15/14* (2006.01)
*B41F 15/36* (2006.01)

(52) U.S. Cl.
USPC ............................ 101/127; 101/129; 101/114

(58) Field of Classification Search
USPC .................. 101/114, 123, 124, 126, 127, 129
See application file for complete search history.

(56) References Cited

U.S. PATENT DOCUMENTS 5,724,889 A * 3/1998 Aun et al. .................. 101/127.1

FOREIGN PATENT DOCUMENTS

| JP | 61-164895 A | 7/1986 |
| JP | 2001-130160 A | 5/2001 |
| JP | 2006-213000 A | 8/2006 |
| JP | 2006-269555 A | 10/2006 |
| JP | 2006-332254 A | 12/2006 |
| JP | 2008-235761 A | 10/2008 |
| JP | 2008-272964 A | 11/2008 |

OTHER PUBLICATIONS

International Search Report for PCT/JP2010/001161 dated Mar. 16, 2010.

* cited by examiner

*Primary Examiner* — Leslie J Evanisko
(74) *Attorney, Agent, or Firm* — Pearne & Gordon LLP

(57) ABSTRACT

A screen printing device and screen printing method in which, in screen printing which is to be applied to a cavity circuit board configured by bonding board members together, printing misalignment hardly occurs. A mask member has a cavity-portion corresponding mask region MRC where a mask pattern MPC corresponding to cavity-portion electrode patterns is formed on the bottom faces of fitting portions to be fitted into cavity portions CV; and a flat-portion corresponding mask region MRF where a mask pattern MPF corresponding to flat-portion electrode patterns is formed as separate regions. Positioning between the cavity-portion corresponding mask region MRC and the cavity-portion electrode patterns is performed, and screen printing is applied. Positioning between the flat-portion corresponding mask region MRF and the flat-portion electrode patterns is performed, and screen printing is applied.

5 Claims, 13 Drawing Sheets

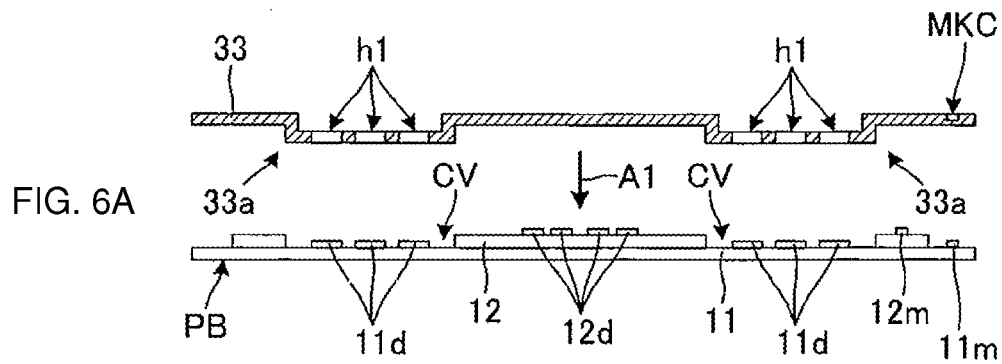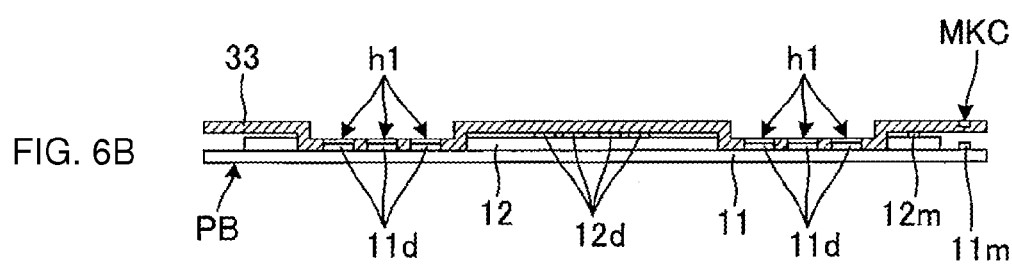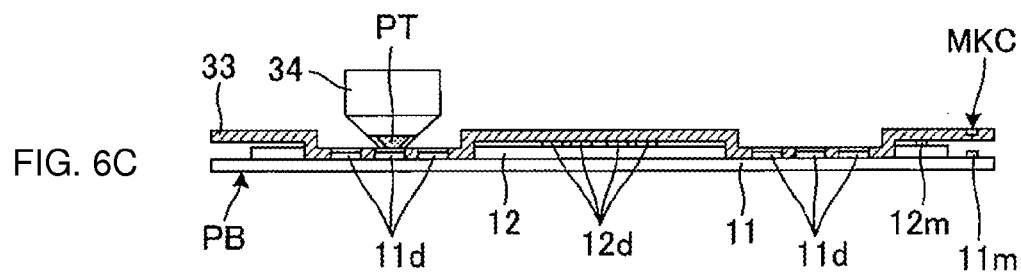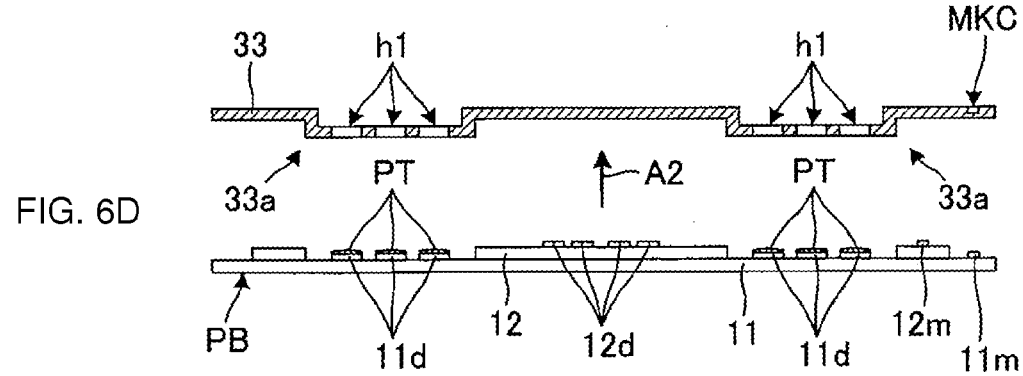

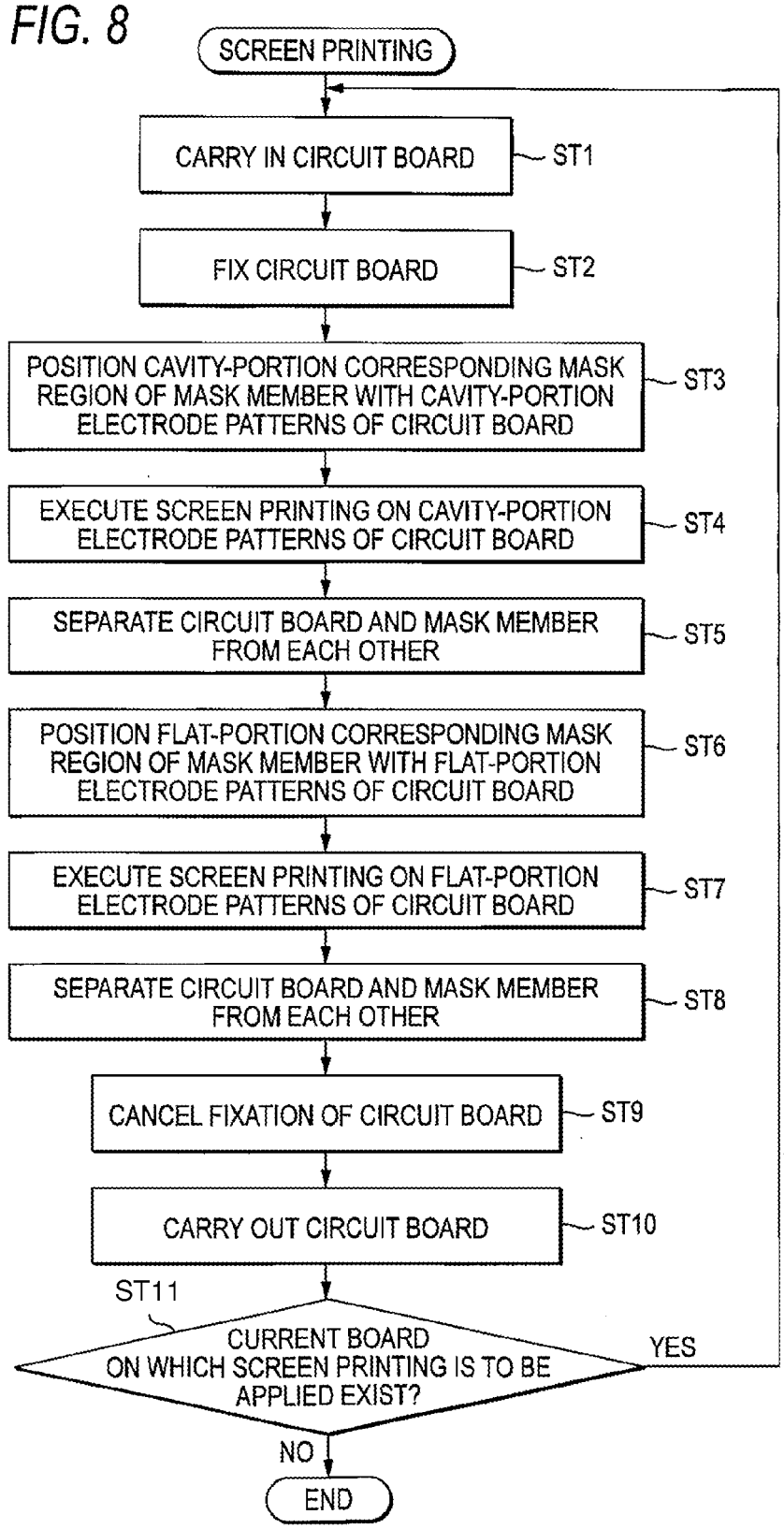

SCREEN PRINTING APPARATUS AND METHOD FOR PRINTING OF CIRCUIT BOARD INCLUDING A MASK HAVING TWO DIFFERENT PATTERNS FOR PRINTING DIFFERENT PARTS OF THE CIRCUIT BOARD IN SEPARATE PRINTING STEPS

TECHNICAL FIELD

The present invention relates to a screen printing device and screen printing method that apply screen printing on a so-called cavity circuit board in which an electrode pattern is formed on the upper surface of the circuit board, and the bottom surfaces of openings disposed in a part of the upper surface of the circuit board.

BACKGROUND ART

Conventionally, a so-called cavity circuit board is known which is configured by bonding an upper-layer board member to the upper surface of a lower-layer board member, and in which an electrode pattern is formed on the upper surface of the circuit board, and the bottom surfaces of openings (cavity portions) disposed in a part of the upper surface, and such a circuit board is used in various apparatuses as a lightweight and high-density circuit board as a lightweight and high-density circuit board (Patent Reference 1).

In a screen printing device which performs screen printing of a paste such as a solder paste on each of the both electrode patterns of such a cavity circuit board, a three-dimensional mask member is used which has a planar portion that is to be contacted with the upper surface of the circuit board, and fitting portions that are projected from the planar portion to be fitted to the cavity portions. In the mask member, a mask pattern corresponding to an electrode pattern (flat-portion electrode pattern) disposed on the upper surface of the circuit board is formed in the planar portion, and that corresponding to an electrode pattern (cavity-portion electrode pattern) disposed on the bottom surfaces of the cavity portions is formed on the bottom surfaces of the fitting portions. When screen printing is performed while the circuit board and the mask member are contacted with each other, therefore, a paste can be printed (transferred) simultaneously onto both the flat-portion electrode pattern and the cavity-portion electrode pattern.

PRIOR ART REFERENCE

Patent Reference

Patent Reference 1: JP-A-2008-235761

SUMMARY OF THE INVENTION

Problems that the Invention is to Solve

In such a cavity circuit board, when the lower-layer board member and the upper-layer board member are bonded to each other, however, a positional displacement may occur. Even when the mask member is positioned with reference to one of the board members (usually, the upper-layer board member), therefore, the positioning of the other board member with respect to the mask member is not always performed in an adequate manner. There is a problem in that, as a result of executing screen printing, printing misalignment occurs over the whole of the circuit board.

Therefore, it is an object of the invention to provide a screen printing device and screen printing method in which, in screen printing which is to be applied to a cavity circuit board configured by bonding board members together, printing misalignment hardly occurs.

Mode for Carrying Out the Invention

The screen printing device of a first aspect of the invention is a screen printing device that performs screen printing to a circuit board in which an upper-layer board member is bonded to an upper surface of a lower-layer board member on a first electrode pattern formed on an upper surface of the upper-layer board member and a second electrode pattern formed on the upper surface of the lower-layer board member that is bottom surfaces of openings disposed in a part of the upper surface of the upper-layer board member, in a circuit board in which an upper-layer board member is bonded to an upper surface of a lower-layer board member, the screen printing device comprising:

a mask member which has a second electrode pattern corresponding mask region where a second electrode pattern corresponding mask pattern corresponding to the second electrode pattern is formed on bottom faces of fitting portions to be fitted into the openings of the upper-layer board member, and a first electrode pattern corresponding mask region where a first electrode pattern corresponding mask pattern corresponding to the first electrode pattern is formed as separate regions; and print executing means which performs positioning between the second electrode pattern corresponding mask region of the mask member and the second electrode pattern of the circuit board, and performs screen printing on the second electrode pattern, and which performs positioning between the first electrode pattern corresponding mask pattern of the mask member and the first electrode pattern of the circuit board, and performs screen printing on the first electrode pattern.

The screen printing device of a second aspect of the invention is the screen printing device of the first aspect wherein, after the print executing means performs positioning between the second electrode pattern corresponding mask region of the mask member and the second electrode pattern of the circuit board, and performs screen printing on the second electrode pattern, the print executing means performs positioning between the first electrode pattern corresponding mask pattern of the mask member and the first electrode pattern of the circuit board, and performs screen printing on the first electrode pattern.

The screen printing device of a third aspect of the invention is the screen printing device of the first or second aspect wherein a first mark for positioning between the first electrode pattern corresponding mask pattern of the mask member and the first electrode pattern of the circuit board is disposed in the first electrode pattern corresponding mask pattern and the upper surface of the upper-layer board member, and a second mark for positioning between the second electrode pattern corresponding mask region of the mask member and the second electrode pattern of the circuit board is disposed in the second electrode pattern corresponding mask region and the upper surface of the lower-layer board member that is the bottom surfaces of the openings of the upper-layer board member.

The screen printing method of a fourth aspect of the invention is a screen printing method that performs screen printing to a circuit board in which an upper-layer board member is bonded to an upper surface of a lower-layer board member on a first electrode pattern which is formed on an upper surface of the upper-layer board member and a second electrode pattern which is formed on the upper surface of the lower-layer board member that is bottom surfaces of openings disposed in a part of the upper surface of the upper-layer board member, by using a mask member including a second electrode pattern corresponding mask region where a second electrode pattern corresponding mask pattern corresponding to the second electrode pattern is formed on bottom faces of fitting portions to be fitted into the opening of the upper-layer board member and a first electrode pattern corresponding mask region where a first electrode pattern corresponding mask pattern corresponding to the first electrode pattern is formed as separate regions, the screen printing method comprising:

a step of performing positioning between the second electrode pattern corresponding mask region of the mask member and the second electrode pattern of the circuit board, and performing screen printing on the second electrode pattern; and a step of performing positioning between the first electrode pattern corresponding mask region of the mask member and the first electrode pattern of the circuit board, and performing screen printing on the first electrode pattern.

The screen printing method of a fifth aspect of the invention is the screen printing method of the fourth aspect wherein, after executing the step of performing positioning between the second electrode pattern corresponding mask region of the mask member and the second electrode pattern of the circuit board, and performing screen printing on the second electrode pattern, the step of performing positioning between the first electrode pattern corresponding mask region of the mask member and the first electrode pattern of the circuit board, and performing screen printing on the first electrode pattern is executed.

Effects of the Invention

In the invention, the mask member, as separate regions, has: the second electrode pattern corresponding mask region where, on the bottom faces of the fitting portions (cavity portions) to be fitted into the openings of the upper-layer board member, the second electrode pattern corresponding mask pattern corresponding to the second electrode pattern is formed; and the first electrode pattern corresponding mask region where the first electrode pattern corresponding mask pattern corresponding to the first electrode pattern is formed, and, after the second electrode pattern and the first electrode pattern are separately positioned with respect to the respective mask region (the second electrode pattern corresponding mask region and the first electrode pattern corresponding mask region), screen printing is applied. In screen printing which is to be applied to a cavity circuit board configured by bonding board members together, even when a positional displacement occurs in bonding of lower-layer and upper-layer board members together, printing misalignment hardly occurs.

BRIEF DESCRIPTION OF THE DRAWINGS

FIGS. 6A, 6B, 6C, and 6D are side views of the mask member of the screen printing device of the embodiment of the invention, and the cavity circuit board.

FIG. 8 is a flowchart showing screen printing steps which are executed by the screen printing device of the embodiment of the invention.

MODE FOR CARRYING OUT THE INVENTION

Figure 1:
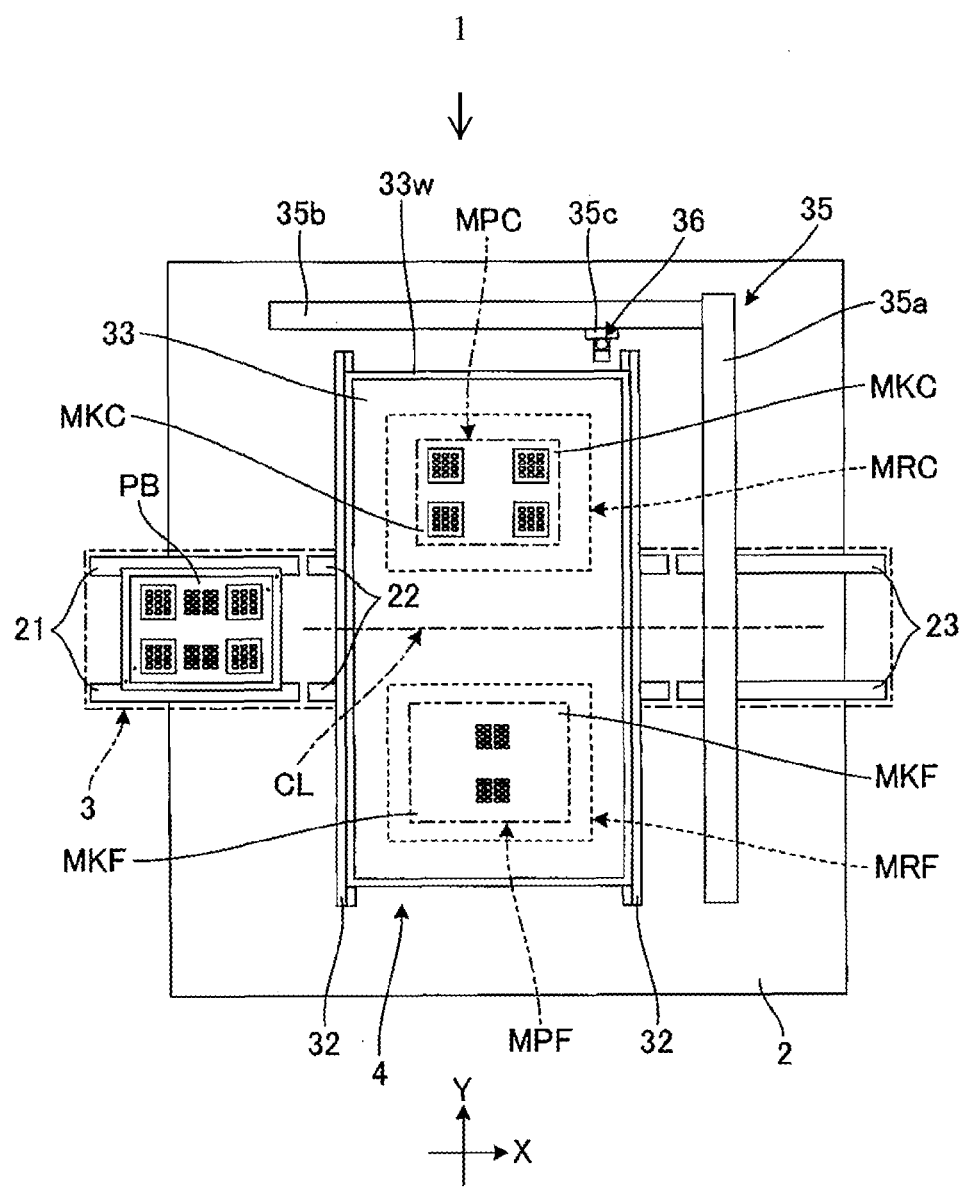
FIG. 1 is a partial plan view of a screen printing device of an embodiment of the invention.
Figure 3:
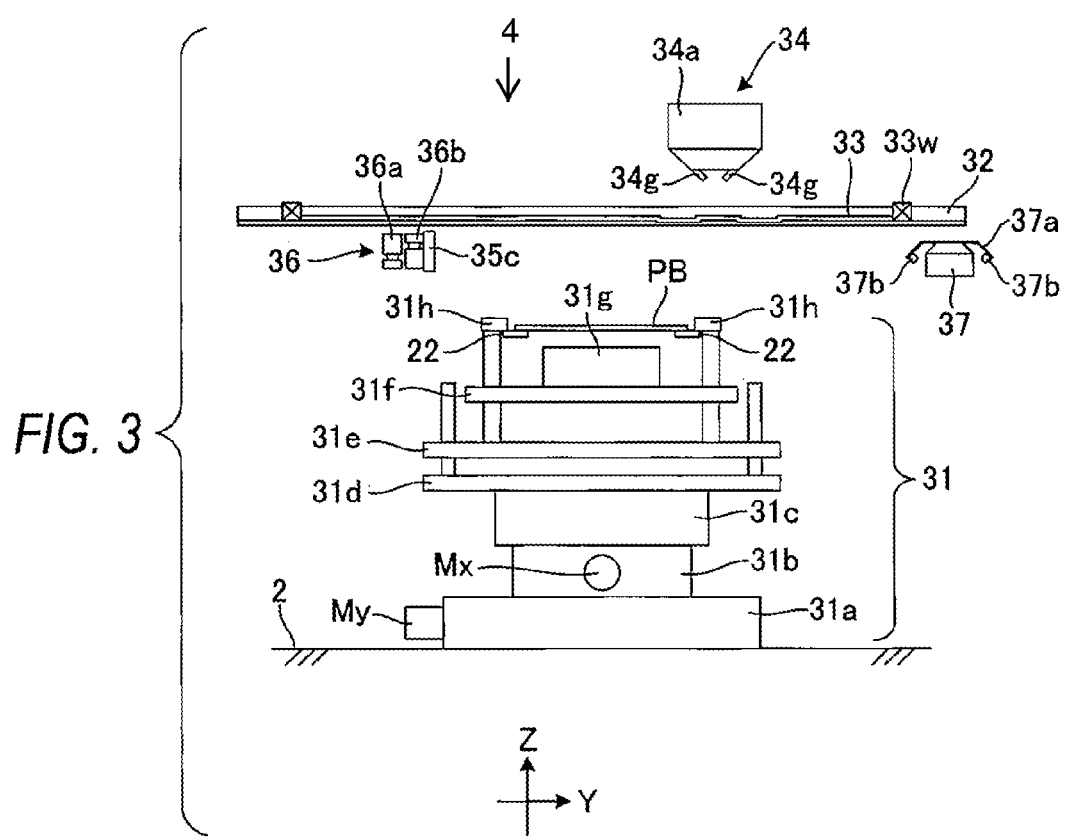
FIG. 3 is a front view of a print executing section of the screen printing device of the embodiment of the invention.
Figures 4A, 4B:
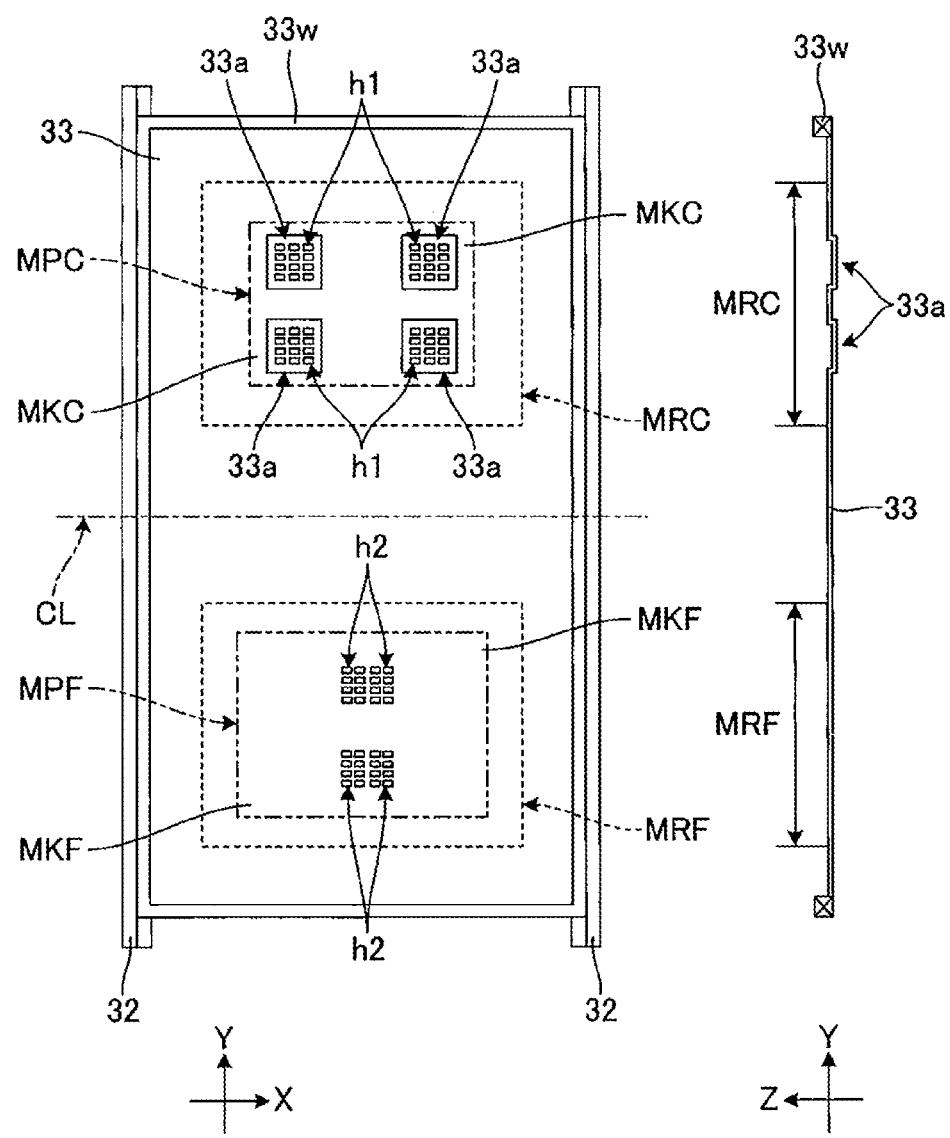
FIG. 4A is a plan view of a mask member of the screen printing device of the embodiment of the invention, and 4B is a side sectional view.
Figure 5:
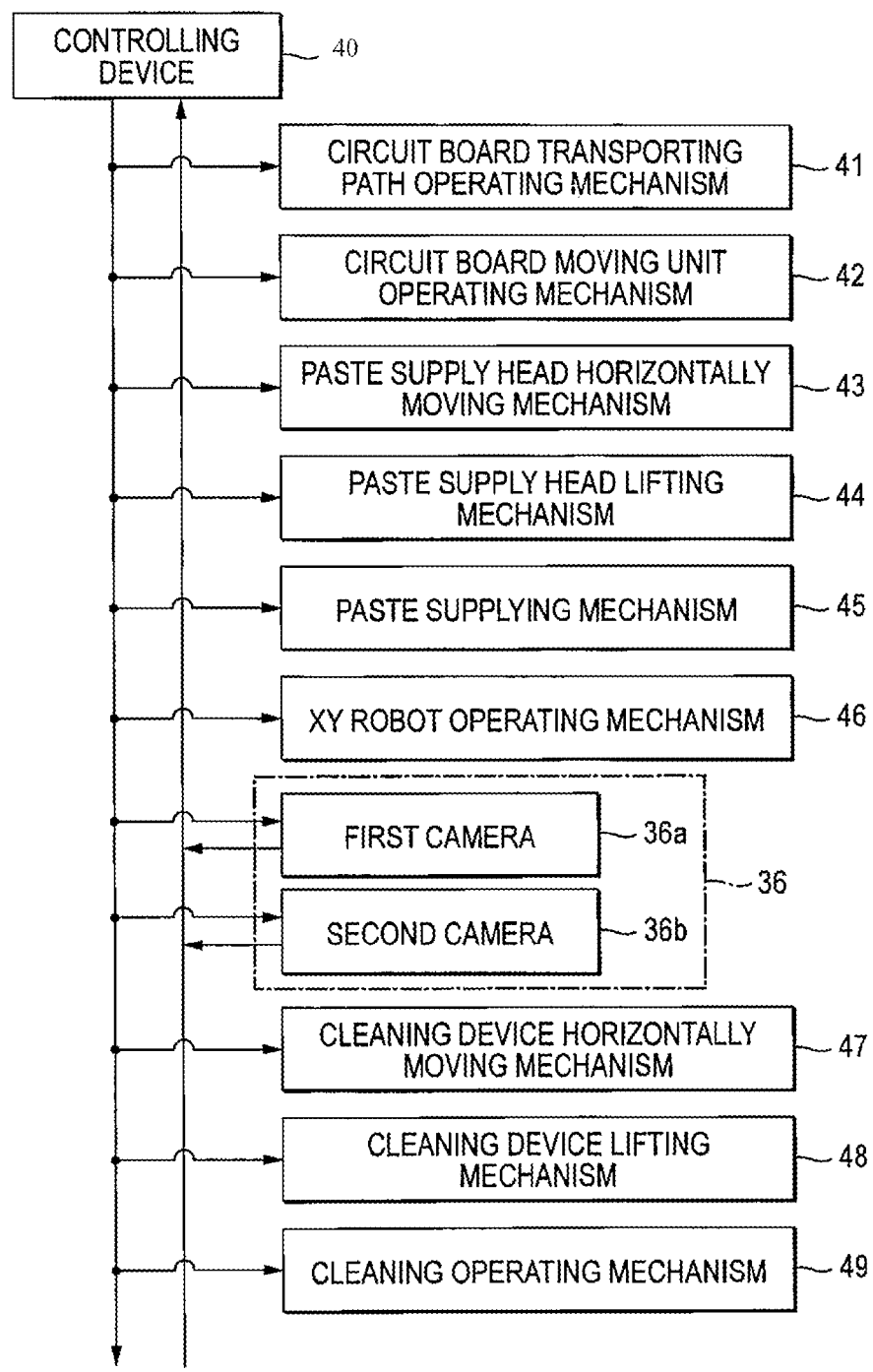
FIG. 5 is a block diagram showing a control system of the screen printing device of the embodiment of the invention.

Hereinafter, an embodiment of the invention will be described with reference to the drawings. FIG. 1 is a partial plan view of a screen printing device of the embodiment of the invention, FIG. 2A is a plan view of a cavity circuit board on which printing is to be performed by the screen printing device of the embodiment of the invention, FIG. 2B is a side sectional view, FIG. 3 is a front view of a print executing section of the screen printing device of the embodiment of the invention, FIG. 4A is a plan view of a mask member of the screen printing device of the embodiment of the invention, FIG. 4B is a side sectional view, FIG. 5 is a block diagram showing a control system of the screen printing device of the embodiment of the invention, FIGS. 6A, 6B, 6C, and 6D, and FIGS. 7A, 7B, 7C, and 7D are side views of the mask member of the screen printing device of the embodiment of the invention, and the cavity circuit board, FIG. 8 is a flowchart showing screen printing steps which are executed by the screen printing device of the embodiment of the invention, FIGS. 9A and 9B, FIGS. 10A and 10B, FIGS. 11A and 11B, and FIGS. 12A and 12B are views illustrating the operation of the screen printing device of the embodiment of the invention, and FIGS. 13A and 13B are views illustrating the operation of a cleaning device of the screen printing device of the embodiment of the invention.

Referring to FIG. 1, the screen printing device 1 of the embodiment is configured by including: a platform 2; a circuit board transporting path 3 which is disposed on the platform 2, and which transports and positions a circuit board PB that is a print object; and a print executing section 4 which performs screen printing on the circuit board PB that is positioned by the circuit board transporting path 3. Hereinafter, the transporting direction of the circuit board PB in the screen printing device 1 is indicated as X-axis direction, and the direction which is perpendicular to the X-axis direction, and which is in the horizontal plane is indicated as Y-axis direction. Furthermore, the vertical direction is indicated as Z-axis direction.

Figure 2A:
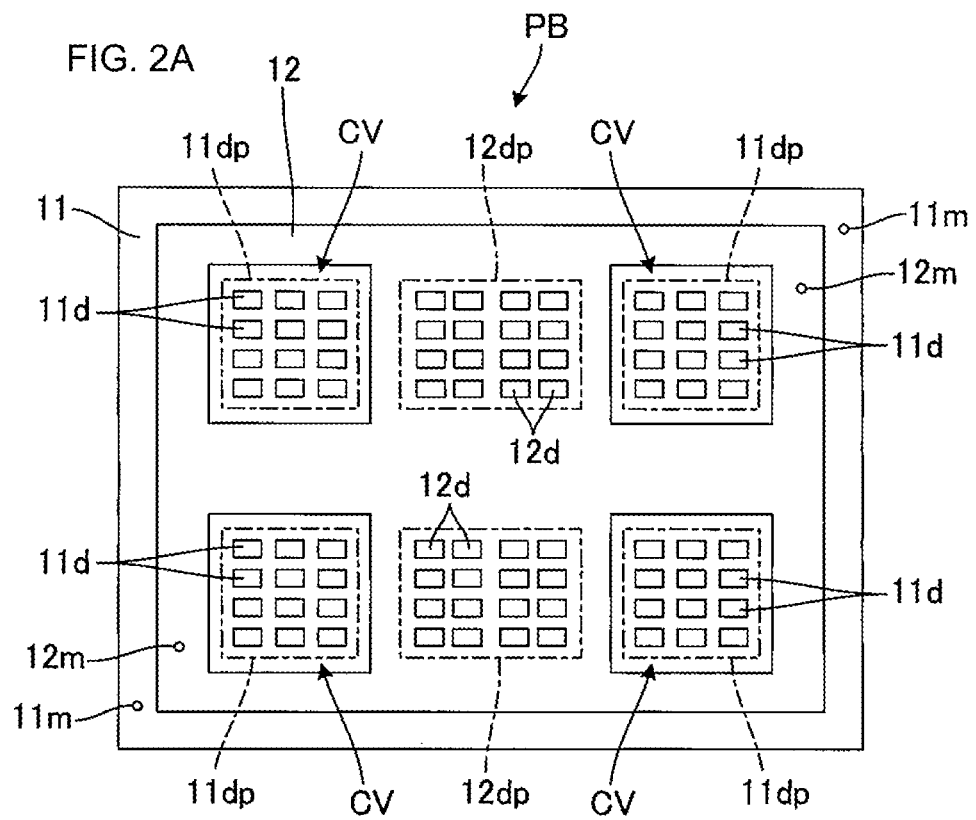
FIG. 2A is a plan view of a cavity circuit board on which printing is to be performed by the screen printing device of the embodiment of the invention.
Figure 2B:
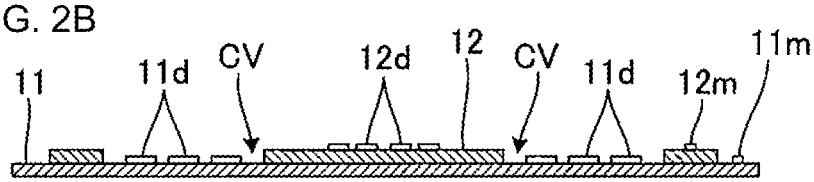
FIG. 2B is a side sectional view.

Referring to FIGS. 2A and 2B, the circuit board PB is configured by bonding an upper-layer board member 12 to the upper surface of a lower-layer board member 11. A plurality of flat-portion electrodes 12d are disposed on the upper surface of the upper-layer board member 12. Flat-portion electrode patterns 12dp are formed on the upper surface of the upper-layer board member 12 by the plurality of flat-portion electrodes 12d. A plurality of cavity-portion electrodes 11d are disposed on the bottom surfaces of cavity portions CV (the upper surface of the lower-layer board member 11) which are openings disposed in a part of the upper surface of the upper-layer board member 12. Cavity-portion electrode patterns 11dp are formed on the bottom surfaces of the cavity portions CV by the plurality of cavity-portion electrodes 11d. Namely, the circuit board PB is a cavity circuit board having the flat-portion electrode patterns 12dp (a first electrode pattern) formed on the upper surface (the upper surface of the upper-layer board member 12), and the cavity-portion electrode patterns 11dp (a second electrode pattern) formed on the bottom surfaces (the upper surface of the lower-layer board member 11) of the openings (the cavity portions CV) disposed in a part of the upper surface.

Referring to FIG. 1, the circuit board transporting path 3 is configured by a carry-in conveyor 21, positioning conveyor 22, and carry-out conveyor 23 which are juxtaposed in the X-axis direction. The carry-in conveyor 21 delivers the circuit board PB which is loaded from the outside (the left side of the sheet of FIG. 1) of the screen printing device 1, into the screen printing device 1, and transfers the circuit board to the positioning conveyor 22. The positioning conveyor 22 positions the circuit board PB which is received from the carry-in conveyor 21, to a predetermined position, and, after the screen printing on the circuit board PB is ended, transfers the circuit board PB to the carry-out conveyor 23. The carry-out conveyor 23 takes out the circuit board PB which is received from the positioning conveyor 22, to the outside of the screen printing device 1.

Referring to FIG. 3, the print executing section 4 includes: a circuit board moving unit 31 which clamps the circuit board PB on the positioning conveyor 22, and which performs a movement of the circuit board PB in the horizontal plane (the X- and Y-axis directions), and that in the vertical direction (the Z-axis direction); a pair of supporting rails 32 which are extended in the horizontal direction (the Y-axis direction) above the circuit board moving unit 31; and a plate-like mask member 33 which is supported by the supporting rails 32. The print executing section 4 further includes: a paste supply head 34 which is disposed movably in the horizontal plane direction and liftably above the mask member 33; a camera unit 36 which is caused to be movable in the horizontal plane direction in a space between the circuit board moving unit 31 and the mask member 33, by an XY robot 35 (FIG. 1) disposed on the platform 2; and a cleaning device 37 which is disposed movably in the horizontal plane direction and liftably below the supporting rails 32, and which is contacted from the lower side with the lower surface of the mask member 33 so as to, after execution of the screen printing steps, clean away paste residue that remains on the lower surface of the mask member 33.

Referring to FIG. 3, the circuit board moving unit 31 of the print executing section 4 is configured by: a Y table 31a which is relatively moved in the Y-axis direction with respect to the platform 2; an X table 31b which is relatively moved in the X-axis direction with respect to the Y table 31a; a θ table 31c which is relatively rotated about the Z axis with respect to the X table 31b; a base plate 31d which is fixed to the θ table 31c; a first liftable plate 31e which is relatively raised and lowered with respect to the base plate 31d; a second liftable plate 31f which is relatively raised and lowered with respect to the first liftable plate 31e; an under supporting unit 31g which is fixed to the second liftable plate 31f; the positioning conveyor 22 constituting the circuit board transporting path 3; and a pair of clampers 31h which are operated to be closed and opened in the Y-axis direction above the positioning conveyor 22.

Referring to FIGS. 1, 4A and 4B, the four sides of the mask member 33 are supported by a frame member 33w which has a rectangular shape in a plan view. In a rectangular region surrounded by the frame member 33w, a cavity-portion corresponding mask region MRC and flat-portion corresponding mask region MRF which are mutually different regions are disposed. A plurality of fitting portions 33a which are to be fitted into the cavity portions CV of the circuit board PB, and which are downward projected are formed in the cavity-portion corresponding mask region MRC. In each of the fitting portions 33a, a plurality of pattern holes h1 which correspond to the plurality of cavity-portion electrodes 11d that are disposed on the upper surface of the lower-layer board member 11 (the bottom surfaces of the cavity portions CV), whereby a cavity-portion corresponding mask pattern MPC is formed. In the flat-portion corresponding mask region MRF, a plurality of pattern holes h2 which correspond to the plurality of flat-portion electrodes 12d that are disposed on the upper surface of the upper-layer board member 12, whereby a flat-portion corresponding mask pattern MPF is formed.

Namely, the mask member 33 has: the cavity-portion corresponding mask region MRC in which the cavity-portion corresponding mask pattern MPC corresponding to the cavity-portion electrode patterns 11dp is formed on the bottom faces of the fitting portions 33a to be fitted into the cavity portions CV (the openings of the upper-layer board member 12) of the circuit board PB; and the flat-portion corresponding mask region MRF in which the flat-portion corresponding mask pattern MPF corresponding to the flat-portion electrode patterns 12dp is formed, as mutually different regions. As seen from FIG. 1, the flat-portion corresponding mask region MRF is formed by one of two regions of the mask member 33 which are located across the center line CL of the mask member 33 that is parallel to the transporting direction (the X-axis direction) of the circuit board PB, and the cavity-portion corresponding mask region MRC is formed by the other of the two regions of the mask member 33 which are located across the center line CL of the mask member 33 that is parallel to the transporting direction of the circuit board PB.

Referring to FIGS. 2A and 2B, sets each configured by two cavity-portion positioning marks 11m are disposed at the diagonal positions of the lower-layer board member 11, and sets each configured by two flat-portion positioning marks 12m are disposed at the diagonal positions of the upper-layer board member 12.

Referring to FIGS. 1 and 4A, by contrast, sets each configured by two cavity-portion corresponding mask-region positioning marks MKC which are used for positioning the cavity-portion corresponding mask region MRC with the cavity-portion electrode patterns 11dp of the circuit board PB are disposed correspondingly with the cavity-portion positioning marks 11m at the diagonal positions of the cavity-portion corresponding mask region MRC in which the cavity-portion corresponding mask pattern MPC of the mask member 33 is formed. Sets each configured by two flat-portion corresponding mask-region positioning marks MKF which are used for positioning the flat-portion corresponding mask region MRF with the flat-portion electrode patterns 12dp of the circuit board PB are disposed correspondingly with the flat-portion positioning marks 12m at the diagonal positions of the flat-portion corresponding mask region MRF in which the flat-portion corresponding mask pattern MPF of the mask member 33 is formed.

Referring to FIG. 3, the paste supply head 34 is disposed so as to be movable in the Y-direction above the supporting rails 32 with respect to the circuit board moving unit 31, and configured by a head body 34a, and two guide members 34g which are disposed in a lower portion of the head body 34a, and which are opposed to each other in the Y-axis direction. Each of the guide members 34g is a "pellet"-like member which is extended in the X-axis direction, and guides a paste such as a solder paste or an electrically conductive paste which is downward pressure-fed from a paste cartridge (not shown) incorporated in the head body 34a, so as to be concentrically supplied to an object place on the mask member 33.

Referring to FIG. 1, the XY robot 35 is configured by: a Y-axis stage 35a which is extended in the Y-axis direction above the platform 2, and which is relatively fixed to the platform 2; an X-axis stage 35b which is extended in the X-axis direction, and which is disposed to be movable in the Y-axis direction on the Y-axis stage 35a; and a moving plate 35c which is disposed to be movable in the X-axis direction on the X-axis stage 35b. Referring to FIG. 3, the camera unit 36 has a configuration where a first camera 36a in which the imaging surface is downward directed, and a second camera 36b in which the imaging surface is upward directed are attached to the moving plate 35c of the XY robot 35.

Referring to FIG. 3, in the cleaning device 37, cleaning paper 37a contacts the lower surface of the mask member 33 from the lower side in the state where the paper is horizontally stretched, and the cleaning paper 37a is horizontally fed by a pair of rollers 37b, whereby the lower surface of the mask member 33 can be cleaned.

The operations of transporting and positioning the circuit board PB by the carry-in conveyor 21, positioning conveyor 22, and carry-out conveyor 23 which constitute the circuit board transporting path 3 are performed by a control in which a controlling device 40 (FIG. 5) of the screen printing device 1 controls the operation of a circuit board transporting path operating mechanism 41 (FIG. 5) configured by an actuator that is not shown, etc.

The operations of moving the Y table 31a in the Y-axis direction with respect to the platform 2; moving the X table 31b in the X-axis direction with respect to the Y table 31a; rotating the θ table 31c about the Z axis with respect to the X table 31b; raising and lowering the first liftable plate 31e with respect to the base plate 31d (i.e., with respect to the θ table 31c); raising and lowering the second liftable plate 31f (i.e., the under supporting unit 31g) with respect to the first liftable plate 31e; and opening and closing the dampers 31h are performed by a control in which the operation of a circuit board moving unit operating mechanism 42 (FIG. 5) configured by actuators such as a Y-table driving motor My and an X-table driving motor Mx (FIG. 3), and the like is controlled by the controlling device 40.

The operation of moving the paste supply head 34 in the horizontal plane direction is performed by a control in which the operation of a paste supply head horizontally moving mechanism 43 (FIG. 5) configured by actuators that are not shown, and the like is controlled by the controlling device 40. The lifting operation of the paste supply head 34 is performed by a control in which the operation of a paste supply head lifting mechanism 44 (FIG. 5) configured by actuators that are not shown, and the like is controlled by the controlling device 40. The operation of supplying the paste from the paste supply head 34 is performed by a control in which the operation of a paste supplying mechanism 45 (FIG. 5) configured by actuators that are not shown, and the like is controlled by the controlling device 40.

The operation of moving the X-axis stage 35b constituting the XY robot 35 in the Y-axis direction, and that of moving the moving plate 35c in the X-axis direction are performed by a control in which the operation of an XY robot operating mechanism 46 (FIG. 5) configured by actuators that are not shown, and the like is controlled by the controlling device 40.

The first camera 36a is controlled by the controlling device 40 so as to take an image of the cavity-portion positioning marks 11m disposed on the lower-layer board member 11 of the circuit board PB, and the flat-portion positioning marks 12m disposed on the upper-layer board member 12. The second camera 36b is controlled by the controlling device 40 so as to take an image of the cavity-portion corresponding mask-region positioning marks MKC and the flat-portion corresponding mask-region positioning marks MKF. The image data obtained by the imaging operation of the first camera 36a, and those obtained by the imaging operation of the second camera 36b are supplied to the controlling device 40 (FIG. 5).

The operation of moving the cleaning device 37 in the horizontal plane direction is performed by a control in which the operation of a cleaning device horizontally moving mechanism 47 (FIG. 5) configured by actuators that are not shown, and the like is controlled by the controlling device 40. The lifting operation of the cleaning device 37 is performed by a control in which the operation of a cleaning device lifting mechanism 48 configured by actuators that are not shown, and the like is controlled by the controlling device 40. The cleaning operation (the feeding operation of the cleaning paper 37a performed by the pair of rollers 37b) is performed by a control in which the operation of a cleaning operating mechanism 49 (FIG. 5) configured by actuators that are not shown, and the like is controlled by the controlling device 40.

In the screen printing in which the mask member 33 is used, and which is performed on the cavity-portion electrode patterns 11dp, the controlling device 40 first causes the circuit board PB and the mask member 33 to approach each other vertically and relatively (the arrow A1 shown in FIG. 6A) in a state where the cavity-portion positioning marks 11m disposed on the lower-layer board member 11 of the circuit board PB, and the cavity-portion corresponding mask-region positioning marks MKC disposed in the cavity-portion corresponding mask region MRC of the mask member 33 are vertically coincident with each other (FIG. 6A), whereby the fitting portions 33a in the cavity-portion corresponding mask region MRC of the mask member 33 are fitted from the upper side into the corresponding cavity portions CV of the circuit board PB (FIG. 6B). As a result, the positioning between the cavity-portion corresponding mask region MRC of the mask member 33 and the cavity-portion electrode patterns 11dp of the circuit board PB is performed. Next, the paste PT is pressure-fed from the upper side by the paste supply head 34 into the fitting portions 33a in the cavity-portion corresponding mask region MRC, and supplied onto the cavity-portion electrodes 11d constituting the cavity-portion electrode patterns 11dp, through the pattern holes h1 constituting the cavity-portion corresponding mask pattern MPC (FIG. 6C). Then, the circuit board PB and the mask member 33 are separated from each other vertically and relatively (the arrow A2 shown in FIG. 6D), and the paste PT is printed (transferred) onto the cavity-portion electrodes 11d (FIG. 6D).

Figure 7A:
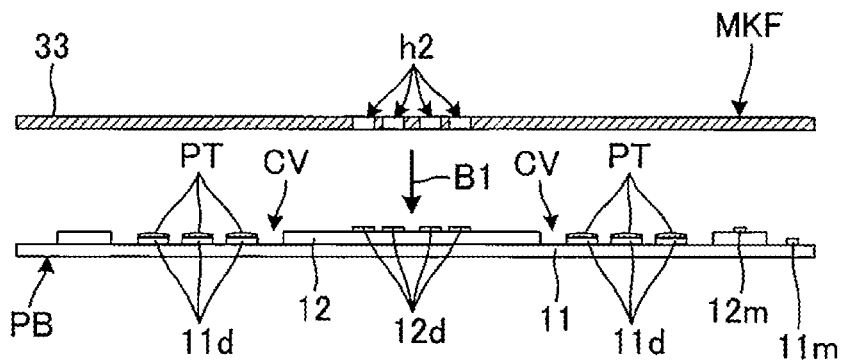
FIGS. 7A, 7B, 7C, and 7D are side views of the mask member of the screen printing device of the embodiment of the invention, and the cavity circuit board.
Figure 7B:
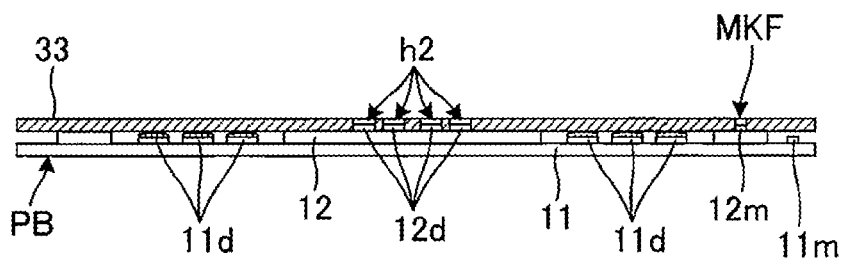
Figure 7C:
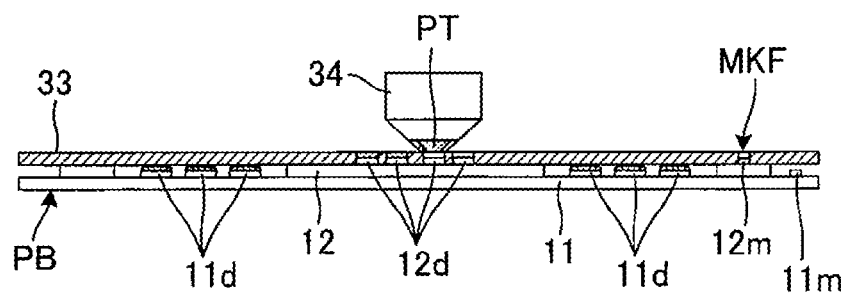
Figure 7D:
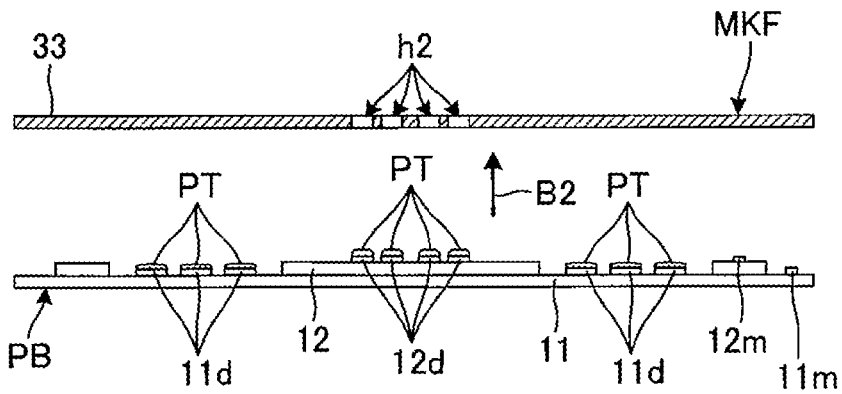

On the other hand, in the screen printing in which the mask member 33 is used, and which is performed on the flat-portion electrode patterns 12dp, the controlling device 40 first causes the circuit board PB and the mask member 33 to approach each other vertically and relatively (the arrow B1 shown in FIG. 7A) in a state where the flat-portion positioning marks 12*m* disposed on the upper-layer board member 12 of the circuit board PB, and the flat-portion corresponding mask-region positioning marks MKF disposed in the flat-portion corresponding mask region MRF of the mask member 33 are vertically coincident with each other (FIG. 7A), whereby the circuit board PB and the mask member 33 are contacted with each other (FIG. 7B). As a result, the positioning between the flat-portion corresponding mask region MRF of the mask member 33 and the flat-portion electrode patterns 12*dp* of the circuit board PB is performed. Next, the paste PT is pressure-fed from the upper side by the paste supply head 34 to the flat-portion corresponding mask region MRF, and supplied onto the flat-portion electrodes 12*d* constituting the flat-portion electrode patterns 12*dp*, through the pattern holes h2 constituting the flat-portion corresponding mask pattern MPF (FIG. 7C). Then, the circuit board PB and the mask member 33 are separated from each other vertically and relatively (the arrow B2 shown in FIG. 7D), and the paste PT is printed (transferred) onto the flat-portion electrodes 12*d* (FIG. 7D).

The flat-portion corresponding mask pattern MPF of the mask member 33 has a plate-like shape. Even when the flat-portion corresponding mask pattern MPF of the mask member 33 is contacted with the upper surface of the circuit board PB in a state where the paste PT is printed on the cavity-portion electrodes 11*d*, therefore, the paste PT on the cavity-portion electrodes 11*d* and the mask member 33 do not interfere with each other. Consequently, the printing of the paste PT in which the flat-portion corresponding mask pattern MPF of the mask member 33 is used, and which is performed on the flat-portion electrode patterns 12*dp* can be performed in the state where the paste PT is printed on the cavity-portion electrodes 11*d* (see FIG. 7). As a result, when the printing of the paste PT to the cavity-portion electrode patterns 11*dp* is performed prior to that of the paste PT to the flat-portion electrode patterns 12*dp*, both the printing of the paste PT to the cavity-portion electrode patterns 11*dp*, and that of the paste PT to the flat-portion electrode patterns 12*dp* can be performed.

Next, the execution procedure of the screen printing by the screen printing device 1 will be described with reference to the flowchart of FIG. 8 and the operation diagrams of FIGS. 9 to 12. When the controlling device 40 senses by means of detecting means which is not shown, that the circuit board PB is loaded from the operator (or another apparatus which is disposed upstream of the screen printing device 1, and which is not shown) to the circuit board transporting path 3 (the carry-in conveyor 21), the controlling device causes the carry-in conveyor 21 and the positioning conveyor 22 to interlockingly operate, thereby carrying in the circuit board PB into the screen printing device 1 (step ST1 of FIG. 8).

Figure 9A:
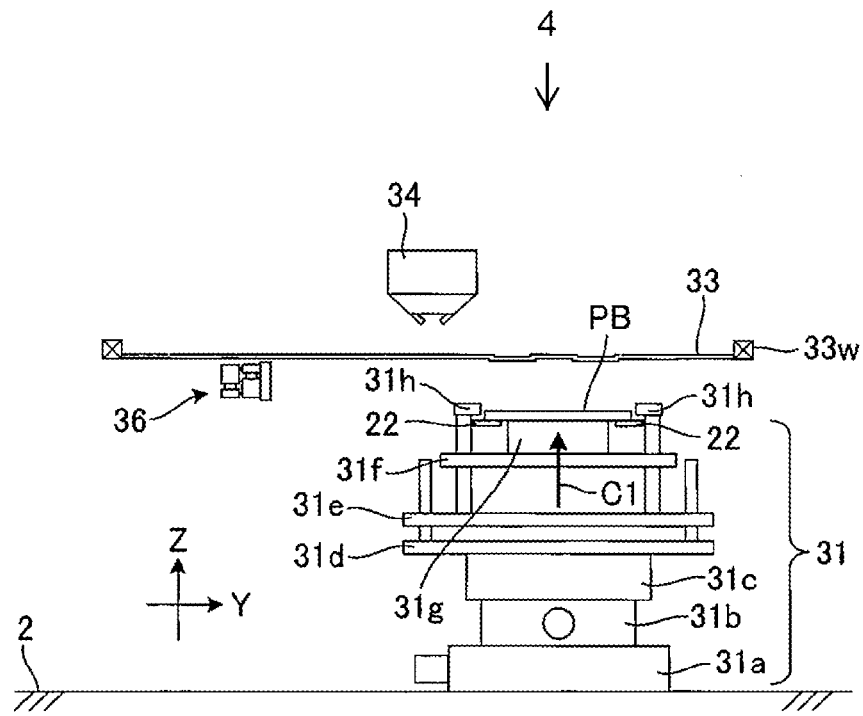
FIGS. 9A and 9B are views illustrating the operation of the screen printing device of the embodiment of the invention.
Figure 9B:
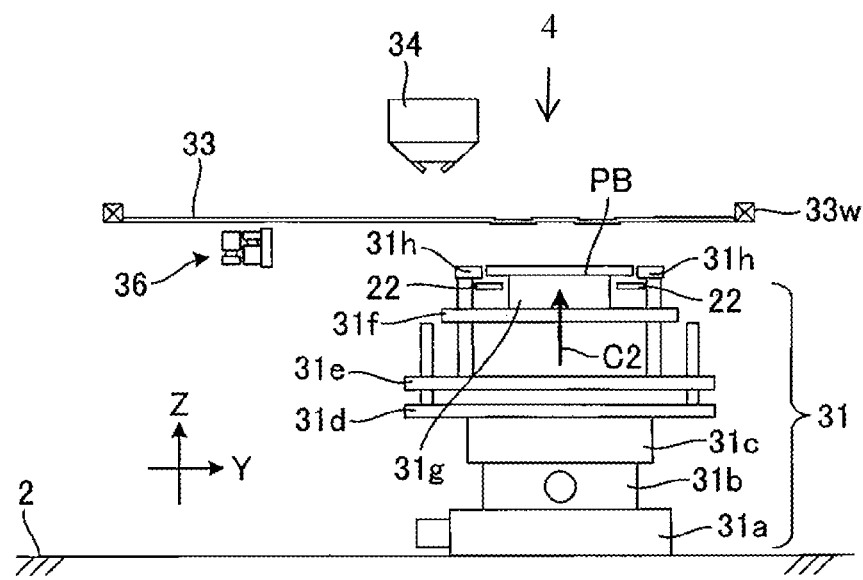

When the circuit board PB is carried in, the controlling device 40 fixes the circuit board PB to the circuit board moving unit 31 (step ST2 of FIG. 8). For this purpose, first, the second liftable plate 31*f* of the circuit board moving unit 31 is relatively raised with respect to the first liftable plate 31*e* (the arrow C1 shown in FIG. 9A), the upper surface of the under supporting unit 31*g* is caused to butt from the lower side against the lower surface of the circuit board PB, so that the circuit board PB is supported by the under supporting unit 31*g* (FIG. 9A). When the circuit board PB is supported by the under supporting unit 31*g*, the circuit board PB is clamped by the clampers 31*h*, and then the second liftable plate 31*f* is further raised (the arrow C2 shown in FIG. 9B), so that the circuit board PB is pushed up by the under supporting unit 31*g*. As a result, the circuit board PB is raised while the both ends are slid with respect to the clampers 31*h*, and fixed to the circuit board moving unit 31 in a state where the circuit board is upward separated from the positioning conveyor 22, and the upper surface of the circuit board PB is at the same level as the upper surfaces of the clampers 31*h* (FIG. 9B).

When the fixation of the circuit board PB is ended, the controlling device 40 performs the positioning between the cavity-portion corresponding mask region MRC of the mask member 33 and the cavity-portion electrode patterns 11*dp* of the circuit board PB (step ST3 of FIG. 8).

In the positioning, the controlling device 40 first moves the camera unit 36 and controls the imaging operation of the first camera 36*a* to obtain image data of the cavity-portion positioning marks 11*m* disposed on the lower-layer board member 11, thereby knowing the positions of the cavity-portion electrode patterns 11*dp*, and moves the camera unit 36 and controls the imaging operation of the second camera 36*b* to obtain image data of the cavity-portion corresponding mask-region positioning marks MKC disposed on the mask member 33, thereby knowing the position of the cavity-portion corresponding mask region MRC.

Figure 10A:
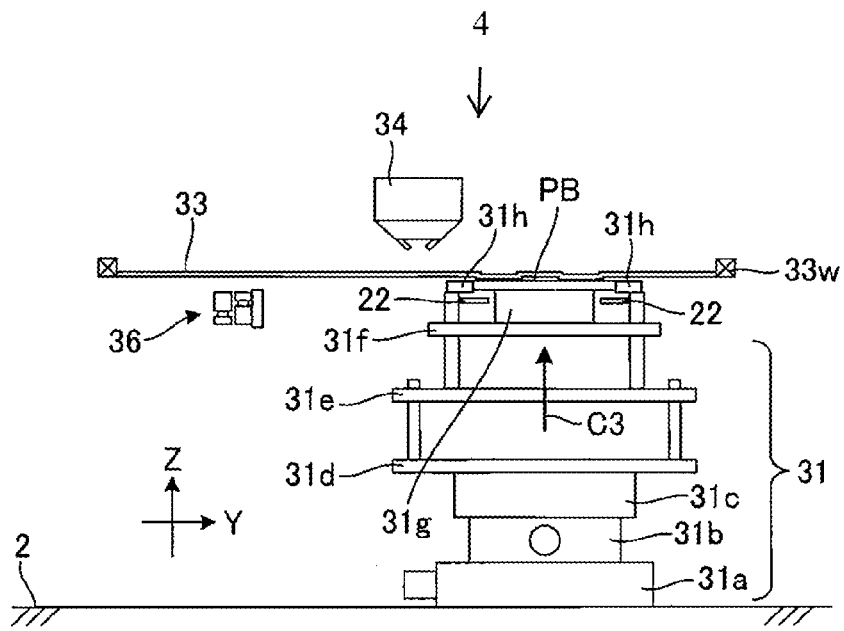
FIGS. 10A and 10B are views illustrating the operation of the screen printing device of the embodiment of the invention.

When the positions of the cavity-portion electrode patterns 11*dp* and the cavity-portion corresponding mask region MRC are known, the controlling device 40 causes the circuit board moving unit 31 to move the circuit board PB in the horizontal plane direction, thereby locating the circuit board PB immediately below the cavity-portion corresponding mask region MRC of the mask member 33, and then perform the vertical movement of the circuit board PB (the rising of the first liftable plate 31*e*) to cause the circuit board PB to be contacted from the lower side with the mask member 33 (the arrow C3 shown in FIG. 10A). As a result, the positioning between the cavity-portion corresponding mask region MRC of the mask member 33 and the cavity-portion electrode patterns 11*dp* of the circuit board PB is performed (FIG. 10A).

When the positioning between the cavity-portion corresponding mask region MRC of the mask member 33 and the cavity-portion electrode patterns 11*dp* of the circuit board PB is ended, the controlling device 40 executes the screen printing for the cavity-portion electrode patterns 11*dp* (step ST4 of FIG. 8).

Figure 10B:
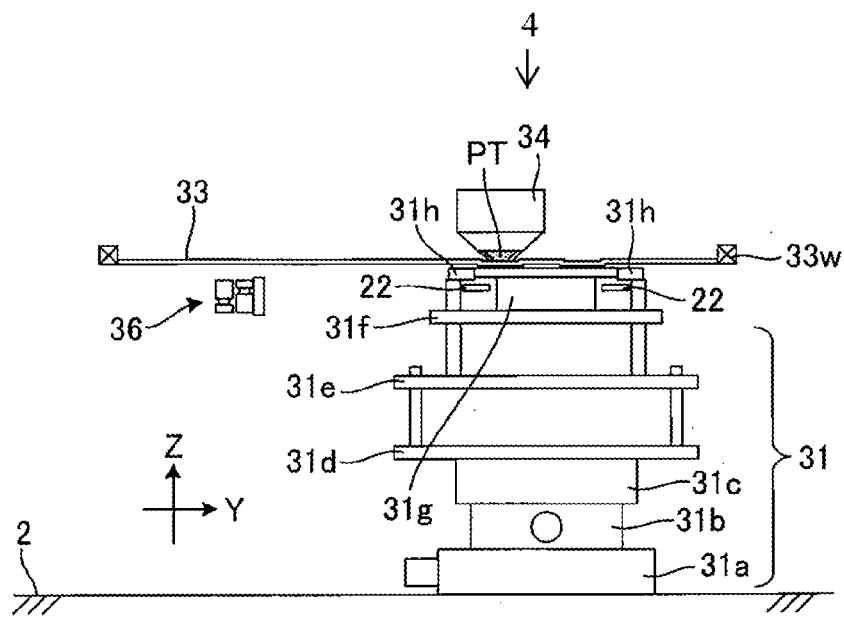

In the screen printing for the cavity-portion electrode patterns 11*dp*, the controlling device 40 first moves the paste supply head 34 to a position above the cavity-portion corresponding mask region MRC, and supplies the paste PT from the paste supply head 34 to the upper surface (into the cavity-portion corresponding mask region MRC) of the mask member 33 through between the two guide members 34*g*, whereby the paste PT is filled into the pattern holes h1 of the cavity-portion corresponding mask pattern MPC (FIG. 10B).

Figure 11A:
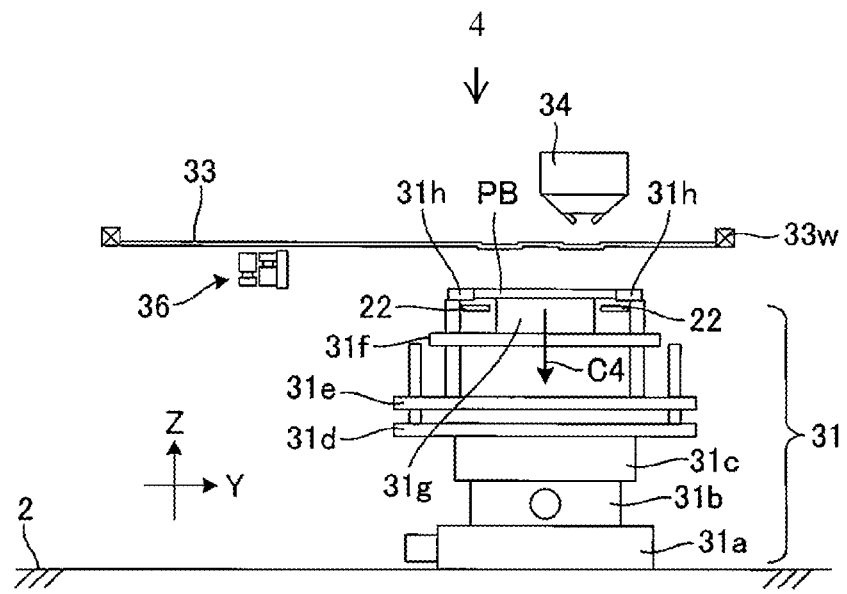
FIGS. 11A and 11B are views illustrating the operation of the screen printing device of the embodiment of the invention.
Figure 11B:
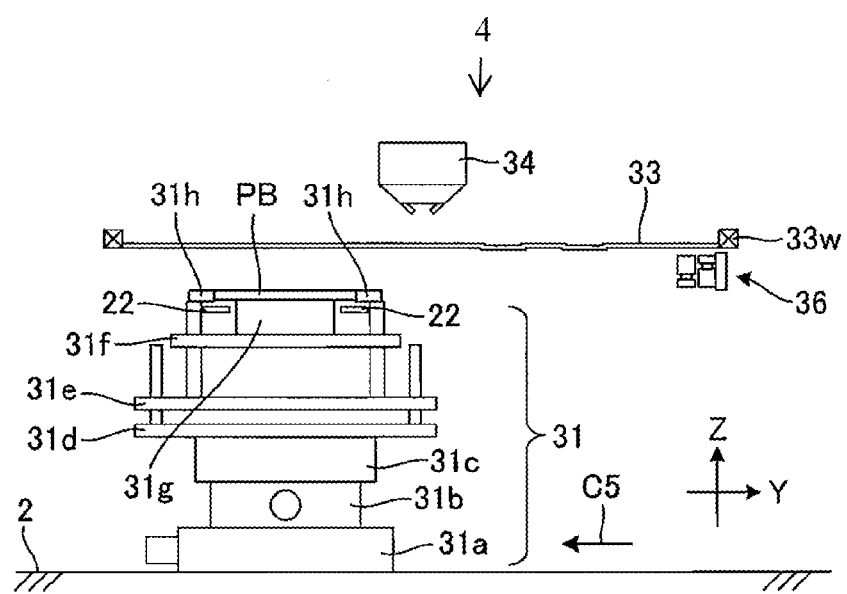
Figure 12A:
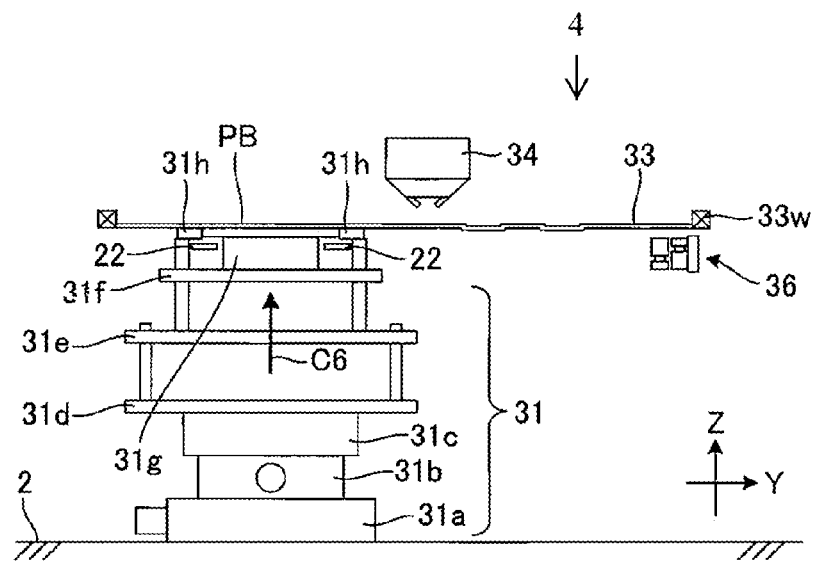
FIGS. 12A and 12B are views illustrating the operation of the screen printing device of the embodiment of the invention.

When the paste PT is filled into the pattern holes h1 of the cavity-portion corresponding mask pattern MPC, the controlling device 40 lowers the first liftable plate 31*e* (the arrow C4 shown in FIG. 11A) to separate the circuit board PB and the mask member 33 from each other (step ST5 of FIG. 8), whereby separation is performed, and the paste PT filled into the pattern holes h1 of the cavity-portion corresponding mask pattern MPC is printed onto the cavity-portion electrode patterns 11*dp* (FIG. 11A).

As a result, the screen printing step (the first screen printing step, steps ST3 to ST5) for the cavity-portion electrode patterns 11*dp* is ended, and a screen printing step (a second first screen printing step, steps ST6 to ST9) which will be described below, and which is to be performed on the flat-portion electrode patterns 12*dp* is next executed.

In the screen printing step for the flat-portion electrode patterns 12*dp*, the controlling device 40 first performs the positioning between the flat-portion corresponding mask region MRF of the mask member 33 and the flat-portion electrode patterns 12*dp* of the circuit board PB (step ST6 of FIG. 8).

In the positioning, the controlling device 40 first moves the camera unit 36 and controls the imaging operation of the first camera 36*a* to obtain image data of the flat-portion positioning marks 12*m* disposed on the upper-layer board member 12, thereby knowing the positions of the flat-portion electrode patterns 12*dp*, and moves the camera unit 36 and controls the imaging operation of the second camera 36*b* to obtain image data of the flat-portion corresponding mask-region positioning marks MKF disposed on the mask member 33, thereby knowing the position of the flat-portion corresponding mask region MRF.

When the positions of the flat-portion electrode patterns 12*dp* and the flat-portion corresponding mask region MRF are known, the controlling device 40 causes the circuit board moving unit 31 to move the circuit board PB in the horizontal plane direction (the arrow C5 shown in FIG. 11B), thereby locating the circuit board PB immediately below the flat-portion corresponding mask region MRF of the mask member 33 (FIG. 11B), and then perform the vertical movement of the circuit board PB (the rising of the first liftable plate 31*e*) to cause the circuit board PB to be contacted from the lower side with the lower surface of the mask member 33 (the arrow C6 shown in FIG. 12A). As a result, the positioning between the flat-portion corresponding mask region MRF of the mask member 33 and the flat-portion electrode patterns 12*dp* of the circuit board PB is performed (FIG. 12A).

In the screen printing device 1 of the embodiment, as described above, the positioning between the flat-portion corresponding mask region MRF and the flat-portion electrode patterns 12*dp* is performed by using first marks (the flat-portion corresponding mask-region positioning marks MK and the flat-portion positioning marks 12*m*) which are disposed in the flat-portion corresponding mask region MRF of the mask member 33 and the upper surface of the upper-layer board member 12 in order to perform the positioning between the flat-portion corresponding mask region MRF of the mask member 33 and the flat-portion electrode patterns 12*dp* of the circuit board PB. Moreover, the positioning between the cavity-portion corresponding mask region MRC and the cavity-portion electrode patterns 11*dp* is performed by using second marks (the cavity-portion corresponding mask-region positioning marks MKC and the cavity-portion positioning marks 11*m*) which are disposed in the cavity-portion corresponding mask region MRC of the mask member 33 and the upper surface of the lower-layer board member 11 which is the bottom surfaces of the openings (the cavity portions CV) of the upper-layer board member 12 in order to perform the positioning between the cavity-portion corresponding mask region MRC of the mask member 33 and the cavity-portion electrode patterns 11*dp* of the circuit board PB.

Namely, the positioning between the flat-portion corresponding mask region MRF and the flat-portion electrode patterns 12*dp*, and that between the cavity-portion corresponding mask region MRC and the cavity-portion electrode patterns 11*dp* are performed by using the different marks.

When the positioning between the flat-portion corresponding mask region MRF of the mask member 33 and the flat-portion electrode patterns 12*dp* of the circuit board PB is ended, the controlling device 40 executes the screen printing for the flat-portion electrode patterns 12*dp* (step ST7 of FIG. 8).

Figure 12B:
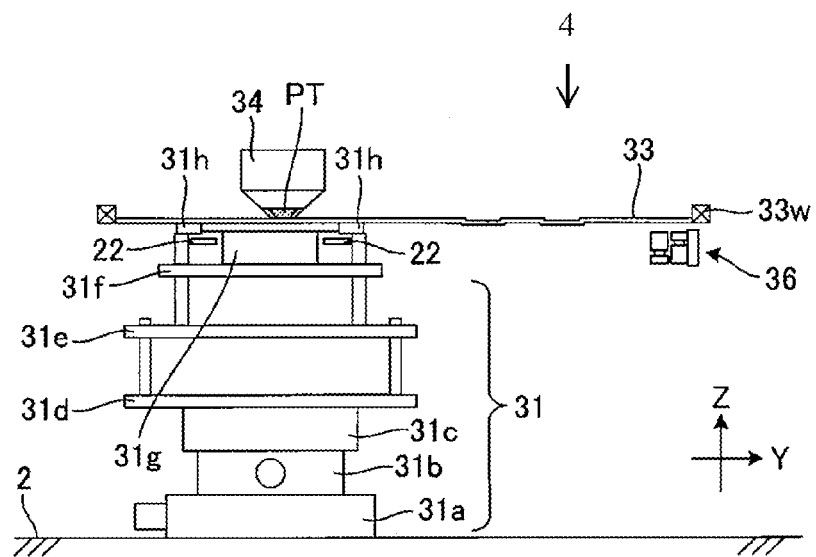
Figure 13A:
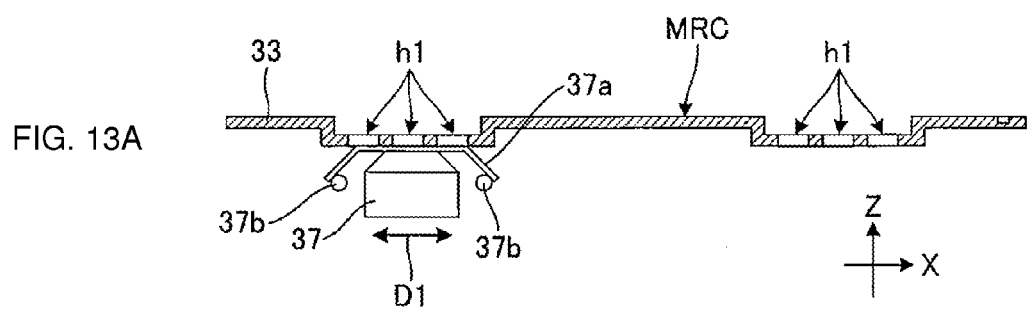
FIGS. 13A and 13B are views illustrating the operation of a cleaning device of the screen printing device of the embodiment of the invention.
Figure 13B:
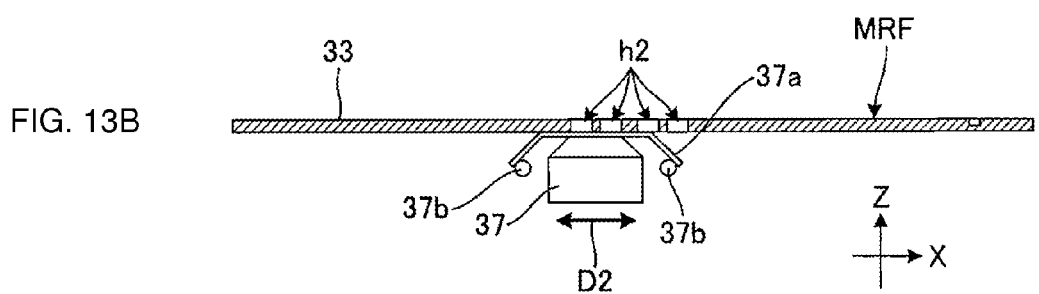

In the screen printing for the flat-portion electrode patterns 12*dp*, the controlling device 40 first moves the paste supply head 34 to a position above the flat-portion corresponding mask region MRF, and supplies the paste PT from the paste supply head 34 to the upper surface (into the flat-portion corresponding mask region MRF) of the mask member 33 through between the two guide members 34*g*, whereby the paste PT is filled into the pattern holes h2 of the flat-portion corresponding mask pattern MPF (FIG. 12B).

When the paste PT is filled into the pattern holes h2 of the flat-portion corresponding mask pattern MPF, the controlling device 40 lowers the first liftable plate 31*e* to separate the circuit board PB and the mask member 33 from each other (step ST8 of FIG. 8), whereby separation is performed, and the paste PT filled into the pattern holes h2 of the flat-portion corresponding mask pattern MPF is printed onto the flat-portion electrode patterns 12*dp*. As a result, the second screen printing step for the flat-portion electrode patterns 12*dp* is ended.

When the screen printing step for the flat-portion electrode patterns 12*dp* is ended, the controlling device 40 opens the clampers 31*h* to cancel the fixation of the circuit board PB with respect to the circuit board moving unit 31 (step ST9 of FIG. 8). Then, the second liftable plate 31*f* is lowered to place the circuit board PB on the positioning conveyor 22, and the circuit board moving unit 31 is operated to adjust the position of the positioning conveyor 22 with respect to the carry-out conveyor 23. When the position adjustment of the positioning conveyor 22 with respect to the carry-out conveyor 23 is ended, the controlling device 40 causes the positioning conveyor 22 and the carry-out conveyor 23 to interlockingly operate, thereby carrying out the circuit board PB from the screen printing device 1 (step ST10 of FIG. 8).

When the circuit board PB is carried out, the controlling device 40 determines whether another circuit board PB on which screen printing is to be applied exists or not (step ST11 of FIG. 8). If, as a result, another circuit board PB on which screen printing is to be applied exists, the process returns to step ST1 to deliver the circuit board PB, and, if another circuit board PB on which screen printing is to be applied does not exist, the series of screen printing steps are ended.

If the controlling device 40 first performs the screen printing for the flat-portion electrode patterns 12*dp*, there occurs an disadvantage that, when the contact of the mask member 33 (the cavity-portion corresponding mask region MRC) with the circuit board PB for the cavity-portion electrode patterns 11*dp* which is to be performed later occurs, the paste PT that is previously printed onto the flat-portion electrode patterns 12*dp* adheres to the lower surface of the mask member 33. In the screen printing device 1 of the embodiment, after the positioning between the cavity-portion corresponding mask region MRC of the mask member 33 and the cavity-portion electrode patterns 11*dp* of the circuit board PB is performed, and the step (first screen printing step) of performing screen printing on the cavity-portion electrode patterns 11*dp* is executed, the controlling device 40 performs the positioning between the flat-portion corresponding mask region MRF of the mask member 33 and the flat-portion electrode patterns 12*dp* of the circuit board PB, and executes the step (second screen printing step) of performing screen printing on the flat-portion electrode patterns 12*dp*, and hence it is possible to prevent the above-described disadvantage from occurring.

When the series of screen printing steps are ended, the controlling device 40 causes the cleaning device 37 clean the lower surface of the mask member 33. In the cleaning of the lower surface of the mask member 33, the cleaning of the cavity-portion corresponding mask region MRC, and that of the flat-portion corresponding mask region MRF are separately performed.

The cleaning of the cavity-portion corresponding mask region MRC of the mask member 33 is performed by, as shown in FIG. 13A, contacting the cleaning paper 37a of the cleaning device 37 with the lower surfaces of the bottom surfaces of the fitting portions 33a in the cavity-portion corresponding mask region MRC, then feeding the cleaning paper 37a by the pair of rollers 37b while moving the cleaning device 37 in the horizontal plane direction (the arrow D1 shown in FIG. 13A), and removing residues of the paste PT adhering to the lower surface of the cavity-portion corresponding mask region MRC (a first cleaning step). The cleaning of the flat-portion corresponding mask region MRF of the mask member 33 is performed by, as shown in FIG. 13B, contacting the cleaning paper 37a of the cleaning device 37 with the lower surface of the flat-portion corresponding mask region MRF, then feeding the cleaning paper 37a by the pair of rollers 37b while moving the cleaning device 37 in the horizontal plane direction (the arrow D2 shown in FIG. 13B), and removing residues of the paste PT adhering to the lower surface of the flat-portion corresponding mask region MRF (a second cleaning step).

As described above, the screen printing device 1 of the embodiment performs screen printing to the circuit board PB in which the upper-layer board member 12 is bonded to the upper surface of the lower-layer board member 11 on the flat-portion electrode patterns 12dp (the first electrode pattern) which are formed on the upper surface of the upper-layer board member 12 and the cavity-portion electrode patterns 11dp (the second electrode pattern) which are formed on the upper surface of the lower-layer board member 11 that is the bottom surfaces of the openings (the cavity portions CV) disposed in a part of the upper surface of the upper-layer board member 12, and includes: the mask member 33 which has the cavity-portion corresponding mask region MRC (a second electrode pattern corresponding mask region) where the cavity-portion corresponding mask pattern MPC (a second electrode pattern corresponding mask pattern) corresponding to the cavity-portion electrode patterns 11dp is formed on the bottom surfaces of the fitting portions 33a to be fitted into the cavity portions CV; and the flat-portion corresponding mask region MRF (a first electrode pattern corresponding mask region) where the flat-portion corresponding mask pattern MPF (a first electrode pattern corresponding mask pattern) corresponding to the flat-portion electrode patterns 12dp is formed as separate regions; and print executing means (the print executing section 4 and the controlling device 40) which performs positioning between the cavity-portion corresponding mask region MRC of the mask member 33 and the cavity-portion electrode patterns 11dp of the circuit board PB, and performs screen printing on the cavity-portion electrode patterns 11dp, and which performs positioning between the flat-portion corresponding mask region MRF of the mask member 33 and the flat-portion electrode patterns 12dp of the circuit board PB, and performs screen printing on the flat-portion electrode patterns 12dp.

Furthermore, the screen printing method of the embodiment is a screen printing method that performs screen printing to the circuit board PB in which the upper-layer board member 12 is bonded to the upper surface of the lower-layer board member 11 on the flat-portion electrode patterns 12dp (the first electrode pattern) which are formed on the upper surface of the upper-layer board member 12 and the cavity-portion electrode patterns 11dp (the second electrode pattern) which are formed on the upper surface of the lower-layer board member 11 that is the bottom surfaces of the openings (the cavity portions CV) disposed in a part of the upper surface of the upper-layer board member 12, by using the mask member 33 which has: the cavity-portion corresponding mask region MRC (the second electrode pattern corresponding mask region) where, the cavity-portion corresponding mask pattern MPC (the second electrode pattern corresponding mask pattern) corresponding to the cavity-portion electrode patterns 11dp is formed on the bottom faces of the fitting portions 33a to be fitted into the cavity portions CV; and the flat-portion corresponding mask region MRF (the first electrode pattern corresponding mask region) where the flat-portion corresponding mask pattern MPF (the first electrode pattern corresponding mask pattern) corresponding to the flat-portion electrode patterns 12dp is formed, as separate regions, the method including: a step (first screen printing step) of performing positioning between the cavity-portion corresponding mask region MRC of the mask member 33 and the cavity-portion electrode patterns 11dp of the circuit board PB, and performing screen printing on the cavity-portion electrode patterns 11dp; and a step (second screen printing step) of performing positioning between the flat-portion corresponding mask region MRF of the mask member 33 and the flat-portion electrode patterns 12dp of the circuit board PB, and performing screen printing on the flat-portion electrode patterns 12dp.

In the screen printing device 1 of the embodiment and the screen printing method, the mask member 33 has the cavity-portion corresponding mask region MRC where, the cavity-portion corresponding mask pattern MPC corresponding to the cavity-portion electrode patterns 11dp is formed on the bottom faces of the fitting portions 33a to be fitted into the openings (the cavity portions CV) of the upper-layer board member 12 and the flat-portion corresponding mask region MRF where the flat-portion corresponding mask pattern MPF corresponding to the flat-portion electrode patterns 12dp is formed as separate regions, and, after the cavity-portion electrode patterns 11dp and the flat-portion electrode patterns 12dp are separately positioned with respect to the respective mask region (the cavity-portion corresponding mask region MRC or the flat-portion corresponding mask region MRF), screen printing is applied. In screen printing which is to be applied to a cavity circuit board configured by bonding board members together, even when a positional displacement occurs in bonding of the lower-layer board member 11 and the upper-layer board member 12 together, therefore, printing misalignment hardly occurs.

Although the embodiment of the invention has been described, the invention is not limited to the configuration shown in the above-described embodiment. In the above-described embodiment, for example, the case where the circuit board PB is a cavity circuit board which is configured by bonding two board members (the lower-layer board member 11 and the upper-layer board member 12) together has been exemplified. The circuit board PB to which the invention is directed is requested to at least include two board members (the lower-layer board member 11 and the upper-layer board member 12) that are bonded together, and may be configured by bonding three or more board members together. Moreover, the method of supplying the paste may be performed by a supply using an open squeegee, and not limited to that using a paste cartridge.

The application is based on Japanese Patent Application (No. 2009-062317) filed Mar. 16, 2009, and its disclosure is incorporated herein by reference.

INDUSTRIAL APPLICABILITY

A screen printing device and screen printing method in which, in screen printing which is to be applied to a cavity

DESCRIPTION OF REFERENCE NUMERALS AND SIGNS 1 screen printing device
4 print executing section (print executing means)
11 lower-layer board member
11*dp* cavity-portion electrode pattern (second electrode pattern)
11*m* cavity-portion positioning mark (second mark)
12 upper-layer board member
12*dp* flat-portion electrode pattern (first electrode pattern)
12*m* flat-portion positioning mark (first mark)
33 mask member
33*a* fitting portion
40 controlling device (print executing means)
MPC cavity-portion corresponding mask pattern (second electrode pattern corresponding mask pattern)
MPF flat-portion corresponding mask pattern (first electrode pattern corresponding mask pattern)
MRC cavity-portion corresponding mask region (second electrode pattern corresponding mask region)
MRF flat-portion corresponding mask region (first electrode pattern corresponding mask region)
PB circuit board
CV cavity portion (opening)
MKC cavity-portion corresponding mask-region positioning mark (second mark)
MKF flat-portion corresponding mask-region positioning mark (first mark)

The invention claimed is:

1. A screen printing device that performs screen printing to a circuit board in which an upper-layer board member is bonded to an upper surface of a lower-layer board member on a first electrode pattern formed on an upper surface of the upper-layer board member and a second electrode pattern formed on the upper surface of the lower-layer board member that is bottom surfaces of openings disposed in a part of the upper surface of the upper-layer board member, in the circuit board in which the upper-layer board member is bonded to the upper surface of the lower-layer board member, the screen printing device comprising:
a mask member which has a second electrode pattern corresponding mask region where a second electrode pattern corresponding mask pattern corresponding to the second electrode pattern is formed on bottom faces of fitting portions to be fitted into the openings of the upper-layer board member, and a first electrode pattern corresponding mask region where a first electrode pattern corresponding mask pattern corresponding to the first electrode pattern is formed as separate regions; and
print executing means which performs positioning between the second electrode pattern corresponding mask region of the mask member and the second electrode pattern of the circuit board, and performs screen printing on the second electrode pattern, and which performs positioning between the first electrode pattern corresponding mask pattern of the mask member and the first electrode pattern of the circuit board, and performs screen printing on the first electrode pattern.

2. A screen printing device according to claim 1, wherein, after the print executing means performs positioning between the second electrode pattern corresponding mask region of the mask member and the second electrode pattern of the circuit board, and performs screen printing on the second electrode pattern, the print executing means performs positioning between the first electrode pattern corresponding mask pattern of the mask member and the first electrode pattern of the circuit board, and performs screen printing on the first electrode pattern.

3. A screen printing device according to claim 1, wherein
a first mark for positioning between the first electrode pattern corresponding mask pattern of the mask member and the first electrode pattern of the circuit board is disposed in the first electrode pattern corresponding mask pattern and the upper surface of the upper-layer board member, and
a second mark for positioning between the second electrode pattern corresponding mask region of the mask member and the second electrode pattern of the circuit board is disposed in the second electrode pattern corresponding mask region and the upper surface of the lower-layer board member that is the bottom surfaces of the openings of the upper-layer board member.

4. A screen printing method that performs screen printing to a circuit board in which an upper-layer board member is bonded to an upper surface of a lower-layer board member on a first electrode pattern which is formed on an upper surface of the upper-layer board member and a second electrode pattern which is formed on the upper surface of the lower-layer board member that is bottom surfaces of openings disposed in a part of the upper surface of the upper-layer board member, by using a mask member including a second electrode pattern corresponding mask region where a second electrode pattern corresponding mask pattern corresponding to the second electrode pattern is formed on bottom faces of fitting portions to be fitted into the opening of the upper-layer board member and a first electrode pattern corresponding mask region where a first electrode pattern corresponding mask pattern corresponding to the first electrode pattern is formed as separate regions, the screen printing method comprising:
a step of performing positioning between the second electrode pattern corresponding mask region of the mask member and the second electrode pattern of the circuit board, and performing screen printing on the second electrode pattern; and
a step of performing positioning between the first electrode pattern corresponding mask region of the mask member and the first electrode pattern of the circuit board, and performing screen printing on the first electrode pattern.

5. A screen printing method according to claim 4, wherein, after executing the step of performing positioning between the second electrode pattern corresponding mask region of the mask member and the second electrode pattern of the circuit board, and performing screen printing on the second electrode pattern, the step of performing positioning between the first electrode pattern corresponding mask region of the mask member and the first electrode pattern of the circuit board, and performing screen printing on the first electrode pattern is executed.

* * * * *